(12) United States Patent
Wood et al.

(10) Patent No.: US 10,607,699 B2
(45) Date of Patent: Mar. 31, 2020

(54) AVIONICS SYSTEM FOR AN AIRCRAFT

(71) Applicant: AIRBUS OPERATIONS LIMITED, Bristol (GB)

(72) Inventors: Christopher Wood, Bristol (GB); Alessio Cipullo, Bristol (GB); Kayvon Barad, Bristol (GB)

(73) Assignee: AIRBUS OPERATIONS LIMITED, Bristol (GB)

( * ) Notice: Subject to any disclaimer, the term of this patent is extended or adjusted under 35 U.S.C. 154(b) by 0 days.

(21) Appl. No.: 16/217,482

(22) Filed: Dec. 12, 2018

(65) Prior Publication Data

US 2020/0013464 A1    Jan. 9, 2020

(30) Foreign Application Priority Data

Dec. 14, 2017  (GB) .................................. 1720817.4

(51) Int. Cl.
*G02B 6/42* (2006.01)
*G11C 13/04* (2006.01)
*G02B 6/02* (2006.01)
*B64D 43/00* (2006.01)

(52) U.S. Cl.
CPC ............ *G11C 13/042* (2013.01); *B64D 43/00* (2013.01); *G02B 6/02076* (2013.01); *G02B 6/42* (2013.01)

(58) Field of Classification Search
CPC ..... G11B 7/124; G11B 7/1362; G11B 7/1384; B64D 45/00; G02B 6/42; G02B 6/43
USPC .......................................................... 385/43
See application file for complete search history.

(56) References Cited

U.S. PATENT DOCUMENTS

| 5,191,458 | A | | 3/1993 | Lyons et al. | |
|---|---|---|---|---|---|
| 5,530,666 | A | * | 6/1996 | Kashyap | G02B 6/28 359/34 |
| 7,584,379 | B2 | * | 9/2009 | Aoyagi | H04W 8/245 714/15 |
| 8,056,800 | B2 | * | 11/2011 | Matsen | G06Q 10/087 235/376 |
| 8,490,666 | B2 | * | 7/2013 | Margot | B60C 1/0016 152/524 |
| 2005/0271316 | A1 | * | 12/2005 | Weaver | G02B 6/0208 385/10 |
| 2006/0013108 | A1 | | 1/2006 | Maxwell et al. | |

(Continued)

FOREIGN PATENT DOCUMENTS

| EP | 3 121 576 | 1/2017 |
|---|---|---|
| EP | 3 246 680 | 11/2017 |

(Continued)

OTHER PUBLICATIONS

Combined Search and Examination Report for GB1720817.4 dated Apr. 30, 2018, 7 pages.

(Continued)

*Primary Examiner* — Akm E Ullah
(74) *Attorney, Agent, or Firm* — Nixon & Vanderhye P.C.

(57) ABSTRACT

A system installed on an aircraft. The system includes a memory storing static information in one or more optical fibre gratings; and an interrogator. The interrogator includes a light source configured to transmit interrogation light to the memory, a receiver configured to receive return light from the memory, and an analyser configured to analyse the return light to obtain the static information.

18 Claims, 8 Drawing Sheets

(56) References Cited

U.S. PATENT DOCUMENTS

| | | | |
|---|---|---|---|
| 2007/0277191 A1* | 11/2007 | Englund | G02B 6/02085 |
| | | | 720/718 |
| 2010/0259752 A1 | 10/2010 | Shah et al. | |
| 2016/0246980 A1* | 8/2016 | Toillon | G06F 21/62 |
| 2016/0275982 A1* | 9/2016 | Austerlitz | G06K 7/00 |
| 2017/0016792 A1* | 1/2017 | Shepherd | B64C 25/001 |
| 2017/0097915 A1 | 4/2017 | Pronto et al. | |
| 2017/0123236 A1* | 5/2017 | Barad | G02B 6/0208 |
| 2019/0277708 A1* | 9/2019 | Miller | G01D 18/00 |
| 2019/0277709 A1* | 9/2019 | Miller | G02B 6/02076 |

FOREIGN PATENT DOCUMENTS

| | | |
|---|---|---|
| WO | 1992/09078 | 5/1992 |
| WO | 2005/029145 | 3/2005 |

OTHER PUBLICATIONS

Rao et al., "Recent progress in fiber-optic extrinsic Fabry-Perot interferometric sensors", *Optical Fiber Technology*, vol. 12, pp. 227-237, 2006.

Extended European Search Report for European Application No. 18212306.7, 10 pages, dated Apr. 11, 2019.

\* cited by examiner

AVIONICS SYSTEM FOR AN AIRCRAFT

CROSS RELATED APPLICATIONS

This application claims priority to United Kingdom (GB) patent application 1720817.4, filed Dec. 14, 2017, the entire contents of which are hereby incorporated by reference.

FIELD OF THE INVENTION

The present invention relates to a system, such as an avionics system, installed on an aircraft.

BACKGROUND OF THE INVENTION

Avionics systems installed on aircraft commonly require static data to be stored, for example to indicate the location of a Line Replaceable Unit (LRU)—an LRU being a modular component of an aircraft that is designed to be replaced quickly at an operating location. A known method of storing such static data is so-called Hardware Pin Programming (HPP). FIG. 1 shows a system 100 using HPP. The system 100 contains three LRUs 102a, 102b, 102c. Each LRU is an identical piece of hardware, and each LRU contains a number of software configurations 104, one of which is executed upon start-up. The software configuration 104 which is executed depends on the location and intended function of the LRU 102a-c.

Each LRU 102a-c has a number of pins 106, and each pin is connected to hardware which either indicates a binary "1" or a binary "0". In this example a first one of the pins of the LRU 102a is connected to a reference voltage 108, a pull-up resistor 110, and an analogue to digital converter 112; and a second one of the pins of the LRU 102a is connected to the same hardware but in this case grounded at 114. So the voltage on the first pin will be high (indicating a binary "1") and the voltage on the second pin will be low (indicating a binary "0").

In this case, the hardware connected to the LRU 102a stores static data represented by the binary number 111000; the hardware connected to the LRU 102b stores static data represented by the binary number 101010; and the hardware connected to the LRU 102c stores static data represented by the binary number 001101.

In this case the static data is encoded by only six binary digits, but if a larger amount of static data is required then the number of pins, and associated hardware, must increase. Often the number of pins can exceed sixteen. This increases the weight and size of the system, which is a particular problem on an aircraft due to the limited space available, and the importance of minimising weight to maximise fuel efficiency.

SUMMARY OF THE INVENTION

A first aspect of the invention provides a system installed on an aircraft as set out in claim 1.

Preferred aspects of the invention are set out in the dependent claims.

A memory stores static information in one or more optical fibre gratings. Such a memory is well suited for use on an aircraft because it is passive, compact, reliable, resistant to electromagnetic interference, and does not degrade in flight.

A light source is configured to transmit interrogation light to the memory, a receiver is configured to receive light from the memory, and an analyser is configured to analyse the light from the memory to obtain the static information.

The receiver receives the light from the memory, and typically outputs an electrical signal containing the static information. The receiver may be a photodetector, for example. The analyser analyses the light from the memory (for instance by analysing the electrical signal) to retrieve the static information. Optionally the receiver and analyser are part of a spectrometer, for example.

The light from the memory may have been transmitted through the memory. In this case, the light from the memory may be representative of an absorbance spectrum of the memory. The interrogation light and the light from the memory may travel to and from the memory along different optical paths, and the light source and the receiver may be physically separated.

More preferably the light from the memory is return light reflected from the memory. In this case, the return light may be representative of a reflectance spectrum, and both the interrogation light and the return light may travel along the same optical path.

Optionally the light source, the receiver and the analyser are part of an interrogator—which may be a modular unit containing the light source, the receiver and the analyser.

In one embodiment of the invention neither the memory nor the interrogator is part of a replaceable unit. In this example the memory or the interrogator may be part of a modular unit which is designed to be permanently connected to the system, rather than being a replaceable unit. So for example the interrogator may be optically coupled to the memory by a splice unit which permanently fuses an optical fibre on the memory side to an optical fibre on the interrogator side.

In another embodiment of the invention, the memory is part of a replaceable unit which can be removed from the system by breaking one or more optical connections between the memory and the rest of the system.

Optionally the light source, the receiver and the analyser are part of an interrogator, and the memory or the interrogator is part of a replaceable unit which can be removed from the system by breaking one or more optical connections between the memory and the interrogator.

Optionally the optical connection comprises a first optical fibre optically coupled to the receiver and the light source; a second optical fibre optically coupled to the memory; and an optical connector which optically couples the first optical fibre to the second optical fibre. In this case the optical connection may be broken by decoupling the first optical fibre from the second optical fibre—for instance by dismantling the optical connector, or by removing one of the optical fibres from the optical connector.

Optionally the replaceable unit comprises the first or second optical fibre, and the first or second optical fibre can be removed from the system along with the rest of the replaceable unit.

The optical connector may comprise a mechanical splice unit, an expanded beam unit or any other arrangement which enables the replaceable unit to be disconnected from the rest of the system.

The one or more optical fibre gratings may consist of a single optical fibre grating (such as a chirped optical fibre grating) but more typically the one or more optical fibre gratings are two or more optical fibre gratings arranged in an optical fibre grating chain.

BRIEF DESCRIPTION OF THE DRAWINGS

Embodiments of the invention will now be described with reference to the accompanying drawings, in which.

DETAILED DESCRIPTION OF EMBODIMENT(S)

Figure 1:
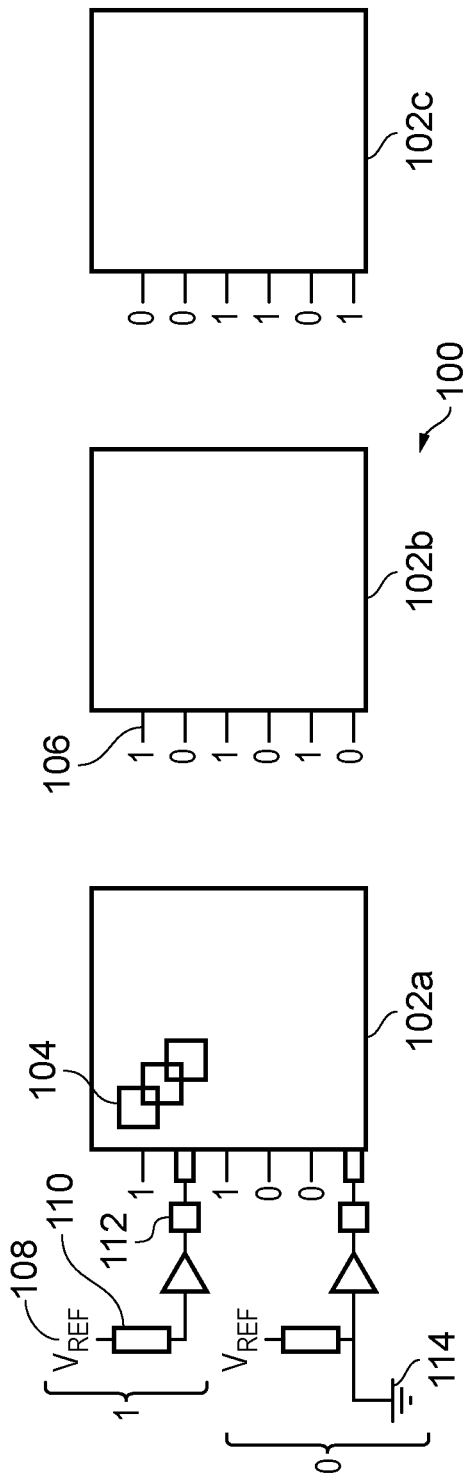
FIG. 1 shows an HPP system.
Figure 2:
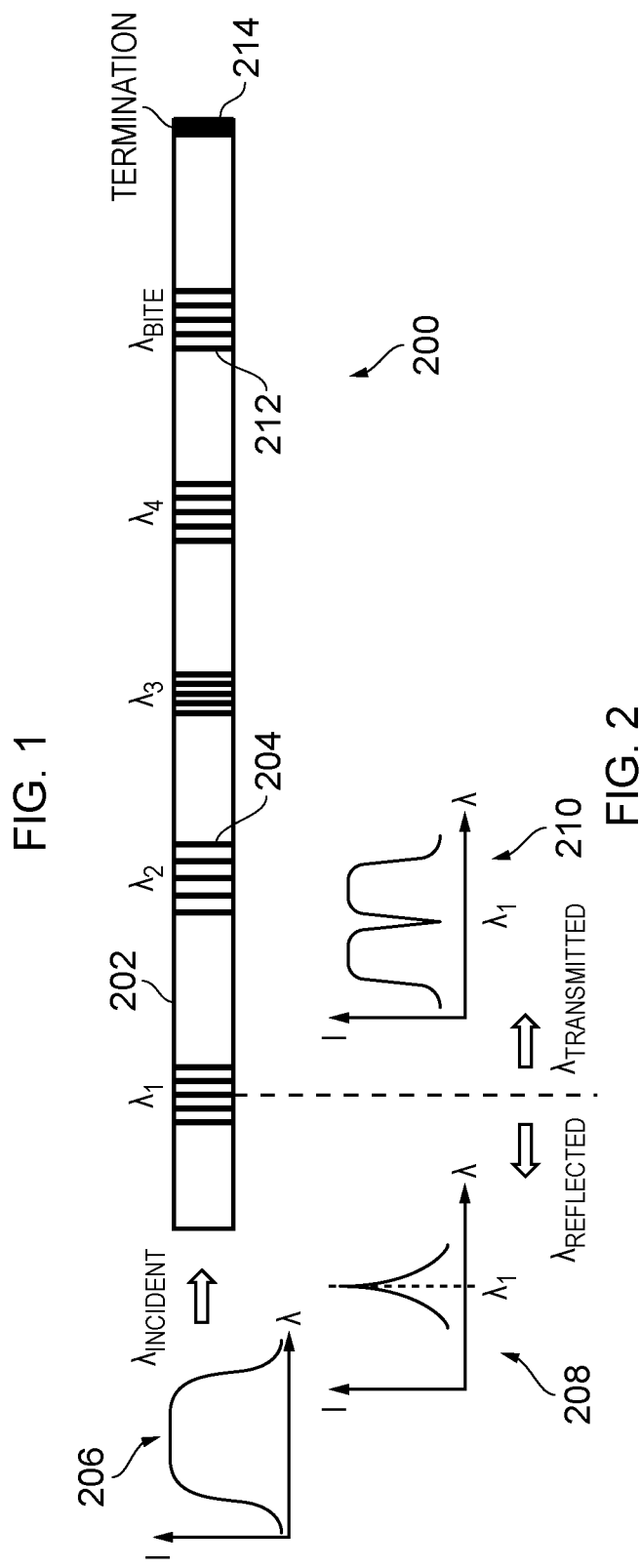
FIG. 2 shows a chain of fibre Bragg gratings.

The avionics systems described below encode static data using a chain of optical fibre gratings, instead of HPP. Referring first to FIG. 2, a chain 200 of fibre Bragg gratings is shown. The chain comprises an optical fibre 202, and a plurality of fibre Bragg gratings 204 arranged in series along the optical fibre 202. The nature of each fibre Bragg grating 204 is such that there is a periodically alternating refractive index in the line of the optical fibre 202. Due to the periodically alternating refractive index, constructive interference takes place only for a specific wavelength of light. This wavelength of light is reflected, and the remaining light is transmitted through the grating 204. The reflected wavelength can be adjusted by adjusting the spacing of the regions of alternating refractive index.

A broadband light source (not shown) shines broadband light (with a spectrum indicated at 206) into the optical fibre 202. Light having the specific wavelength of light resulting from the spacing of the regions of alternating refractive index is reflected by the grating 204 to provide return light with a spectrum as indicated at 208. The remaining light is transmitted—as indicated by spectrum 210.

FIG. 2 shows four fibre Bragg gratings 204, each with a different spacing between the regions of alternating refractive index. In the illustrated gratings, a light band indicates a region with a first refractive index and a dark band indicates a region with a second refractive index. The first grating 204 from the left reflects light of wavelength $\lambda_1$, the second grating 204 reflects light of wavelength of $\lambda_2$, the third grating 204 reflects light of wavelength of $\lambda_3$, and the fourth grating 204 reflects light of wavelength of $\lambda_4$. The fifth and final grating is a Built In Test Equipment (BITE) grating 212. The purpose of the BITE grating 212 is to indicate that all of the data has been collected from the chain 200 by reflecting light having a known wavelength. Failure to collect the reflected light having the characteristic wavelength peak of the BITE grating 212 may indicate that the optical fibre 102 has broken, meaning that data from gratings 204 (including the BITE grating 212) beyond the break has been lost.

At the end of the optical fibre 202 is a termination absorber 214. The termination absorber 214 absorbs any light that has been transmitted through all of the gratings 204 in the optical fibre 202, to make sure that none of it is reflected back through the optical fibre, which may interfere with the light reflected by the gratings 204.

The static information may be stored in the memory 302 in a binary format. For instance, to register a "1", a peak wavelength is expected in a particular range. If the peak wavelength does not appear in this range, either because the grating reflects a peak wavelength outside of this range or because the grating for that bit is omitted, a "0" would be registered.

So in the example of FIG. 2, the chain 200 has four gratings 204 with wavelengths $\lambda_1, \lambda_2, \lambda_3$ and $\lambda_4$ so it stores the binary number 1111. If the chain has only three gratings 204 with wavelengths $\lambda_1, \lambda_2$ and $\lambda_4$ then it stores the binary number 1101; if it has only two gratings 204 with wavelengths $\lambda_1$ and $\lambda_3$ then it stores the binary number 1010; and so on.

Alternatively, the static information may be stored in the chain using a non-binary numbering system, with a base higher than two. For instance, if a peak wavelength is returned within a first range, the digit may be assigned a "0", if a peak wavelength is returned within a second range, the digit may be assigned a "1", if a peak wavelength is returned within a third range, the digit may be assigned a "2", and so on. In this manner, a lot of data can be stored in a fibre of significantly shorter length than one using a binary numbering system. However, it is important that the ranges indicative of each particular data value are provided with enough tolerance that there is no risk of an overlap between adjacent data values due to temperature drift, which could lead to uncertainty in the returned data value. Though only capable of lower storage density, a binary storage system, in particular one in which a grating is either present or not present (and so light is either reflected or not reflected), provides information which is at a much lower risk of being subject to uncertainty.

Figure 3A:
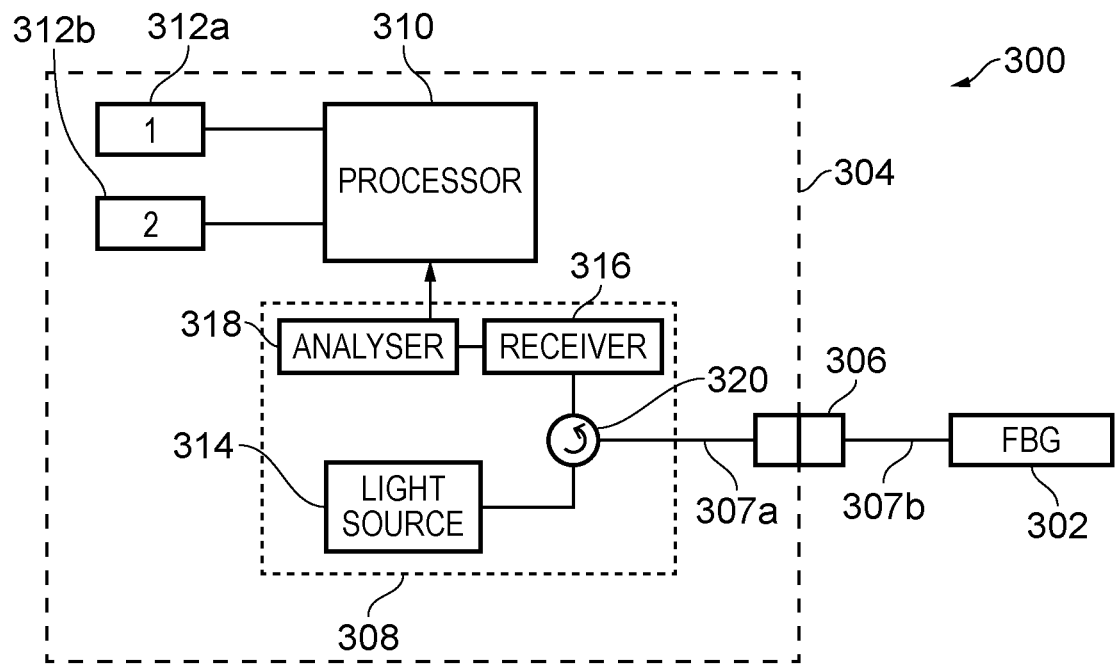
FIG. 3A shows an avionics system with a single LRU.
Figure 10:
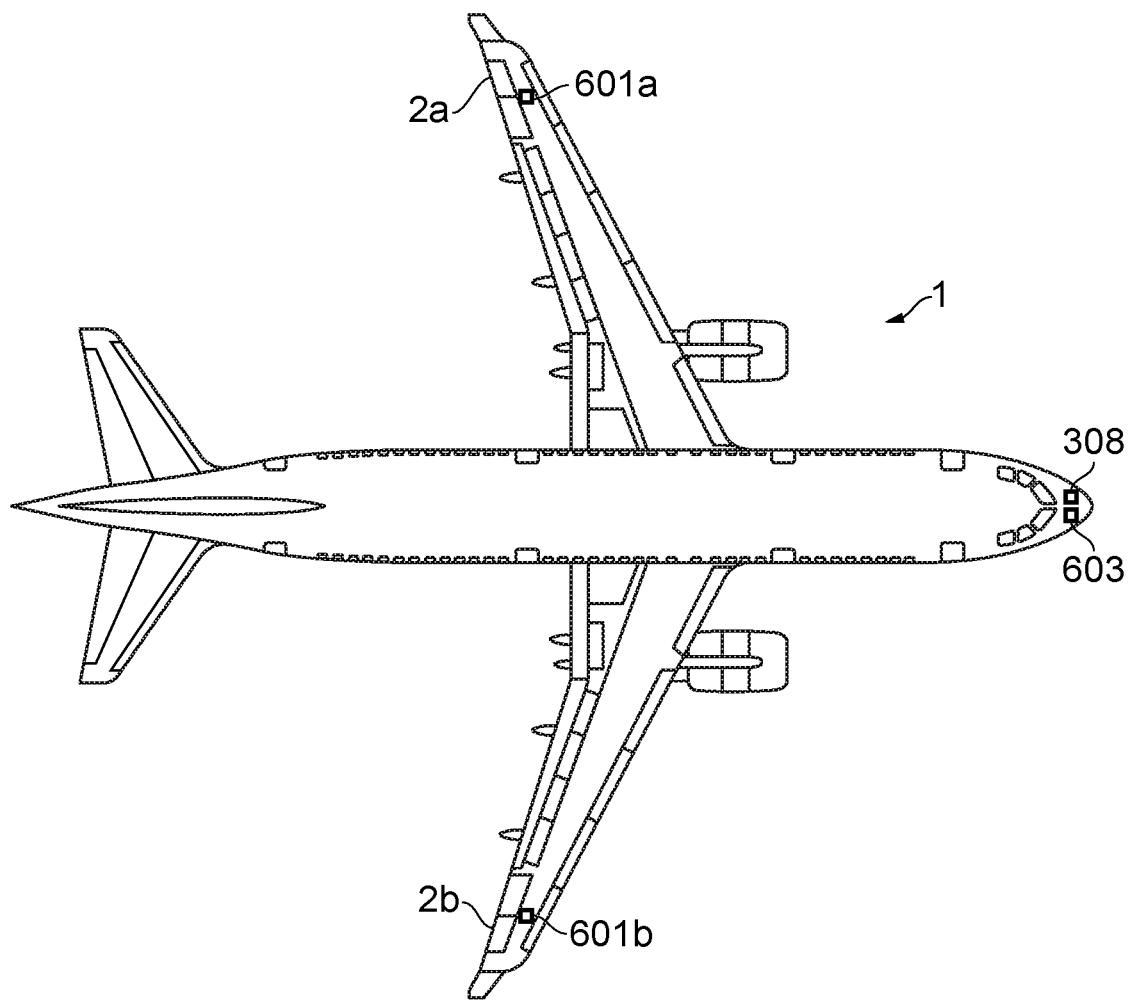
FIG. 10 shows an aircraft with an installed avionics system.

Referring now to FIG. 3A, an avionics system 300 installed on the aircraft 1 of FIG. 10 is shown. The system 300 comprises a memory 302 and a Line Replaceable Unit (LRU) 304. The memory 302 stores static information in a chain of fibre Bragg gratings, using the principles discussed above with reference to FIG. 2.

The LRU 304 contains an interrogator 308 and a processor 310, the processor being capable of executing one of two software configurations 312a, 312b. The LRU 304 is a generic hardware module capable of performing one of a number of specific functions determined by the software configuration that is executed. In this example, two software configurations 312a, 312b are executable, but there could be a greater number of executable software configurations, such as 30 or 1000, for example. The software configuration 312a, 312b which is executed is determined by the static information obtained from the memory 302, which may give an indication of the location of the LRU 304, the intended function of the LRU 304 or simply a direct indication of which software configuration 312a, 312b is to be executed.

The static information is obtained from the memory 302 by the interrogator 308. The interrogator 308 contains a light source 314 (for example a broadband light source such as a superluminescent diode, or a frequency sweeping laser), a receiver 316 (such as a photodetector), an analyser 318 (such as a spectrometer) and a circulator 320. The receiver 316 has the function of generating a receiver output—for instance an analogue or digital electrical signal—from the light received from the memory. The analyser 318 has the function of converting the receiver output into digital information (if the receiver output is analogue) and to analyse it to obtain the static information. The light source 314 transmits interrogation light to the memory 302 via the circulator 320, an optical connector 306 and first and second optical fibres 307*a,b*. The first optical fibre 307*a* is optically coupled to the receiver and the light source; and the second optical fibre 307*b* is optically coupled to the memory.

Using the principles discussed above with reference to FIG. 2, the interrogation light is reflected by the chain of fibre Bragg gratings in the memory 302 and the return light is received by the receiver 316 from the memory 302 via the optical connector 306, the optical fibres 307*a,b* and the circulator 320. The return light will therefore consist of a series of narrow wavelength bands, with the particular wavelength peaks in the bands being determined by each grating in the chain of fibre Bragg gratings. The analyser 318 then analyses the return light received by the receiver 316 to extract the static information stored in the memory 302—which as explained above may be stored in a binary or non-binary format.

After analysing the return light, the analyser 318 transmits the static information to the processor 310, which selects the appropriate software configuration 312*a*, 312*b* accordingly. So for example if the static information is 111111 then configuration 312*a* is selected, and if the static information is 000000 then configuration 312*b* is selected.

As mentioned above, the optical connector 306 and the optical fibres 307*a,b* connect the interrogator 308 and the memory 302. The LRU 304 can be disconnected from rest of the system 300 by breaking the optical connection formed by the optical connector 306 and the optical fibres 307*a,b*—for example by disconnecting or detaching one of the optical fibres from the optical connector 306 or by dismantling the optical connector 306. The LRU 304 can then be removed and replaced or repaired in the course of maintenance for example. As each uninstalled LRU 304 is a generic hardware module capable of performing a number of different functions, batches of spare LRUs can be kept at significantly lower cost and inconvenience than if separate spares of each individual, specific part had to be supplied and kept. Examples of optical connector 306 are discussed below.

Figure 3B:
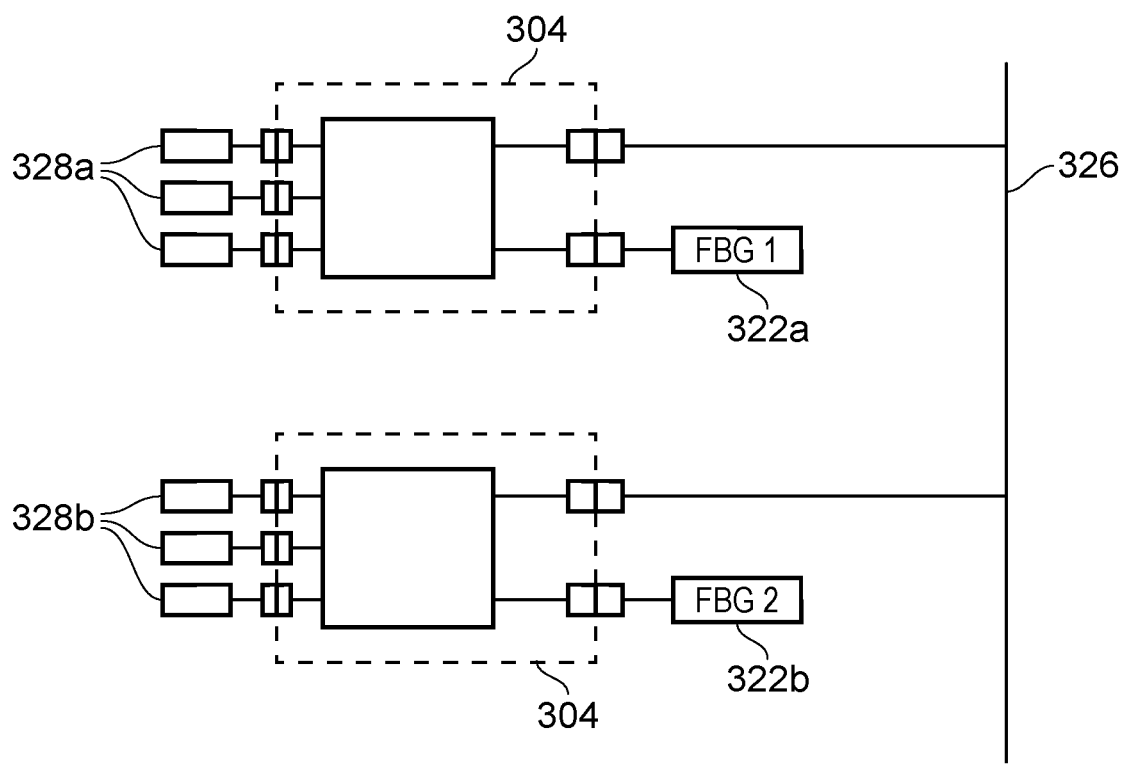
FIG. 3B shows an avionics system with two RDCs.

Referring now to FIG. 3B, an avionics system comprising two of the systems shown in FIG. 3A is shown. As can be seen, each of the systems comprises an LRU 304 and a memory 322*a*, 322*b*. The static information stored in the first memory 322*a* is different from the static information stored in the second memory 322*b*. As the static information stored in the first memory 322*a* is different from the static information stored in the second memory 322*b*, the LRU connected to the first memory 322*a* will execute a different software configuration to the LRU connected to the second memory 322*b*. Thus, the two LRUs will perform different functions. The systems are installed on the aircraft 1 and connected via a bus 326.

In the example of FIG. 3B, each LRU 304 may be a Remote Data Concentrator (RDC) connected, via optical or electrical connectors, to three signal sources 328*a* or 328*b*, which may be sensors for example. The RDC acquires data from the signal sources. By way of example, the signal sources 328*a* may be sensors on a main landing gear of the aircraft, and the signal sources 328*b* may be sensors on a nose landing gear of the aircraft. The static data stored by the first memory 322*a* tells the first RDC (as part of the RDC's start up procedure) that it must configure itself to act as an RDC on a main landing gear, and the static data stored by the second memory 322*a* tells the second RDC (as part of the RDC's start up procedure) that it must configure itself to act as an RDC on a nose landing gear. The two RDCs can thus be replaced or interchanged easily. The static data may also give the unique identity of the aircraft on which the LRU is installed.

Figure 4A:
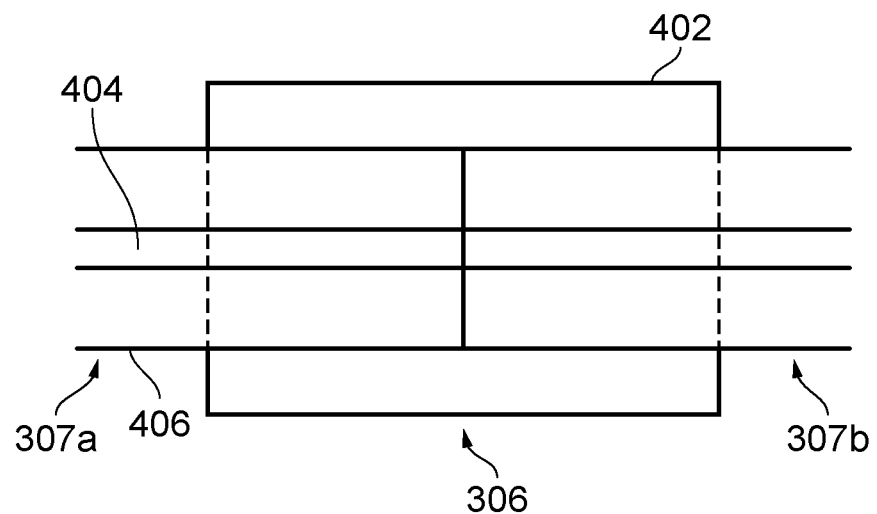
FIG. 4A shows a mechanical splice unit.
Figure 4B:
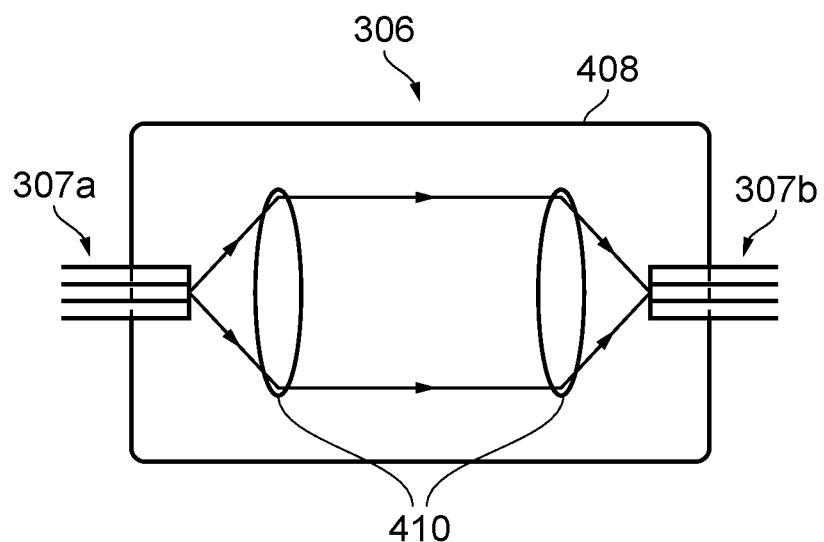
FIG. 4B shows a beam expander.

The optical connector 306 may be a butt-joint demountable optical connector, an expanded beam optical connector, or any other suitable optical coupling device. FIGS. 4A and 4B give two examples.

FIG. 4A shows a first example of an optical connector 306—in this case a butt-joint demountable optical connector. Each optical fibre 307*a,b* comprises a core 404 and a casing 406. The ends of the cores 404 are butted against each other, and held in place by a mechanical splice unit 402. Alternatively, there may be a gap between the ends of the cores 404, the gap being filled with a gel which has a refractive index the same as the refractive index of the core 404. The fibres 307*a,b* are not permanently fused, just precisely held together so that light can pass from one fibre core 404 to the other. The optical connection of FIG. 4A can be dismantled by removing or loosening the splice unit 402 and disconnecting the fibres 307*a,b*.

An alternative optical connector 306 is illustrated in FIG. 4B, which in this case is an expanded beam optical connector. The ends of the two optical fibres 307*a,b* are held at a distance by a unit 408, and two lenses 410 are held between the ends of the optical fibres. As the light leaves the end of one optical fibre, it begins to expand as it is no longer confined in the optical fibre. The light then hits the first lens 410, where it is collimated and directed towards the second lens 410. Upon passing through the second lens 410, the light is focused into the end of the second optical fibre.

The optical connection 306, 307*a,b* of FIG. 4B can be broken by removing one of the optical fibres 307*a* or 307*b* from the unit 408, or by dismantling the unit 408 and moving the two lenses apart.

The expanded beam unit 408 arrangement offers the advantage that it is less sensitive to dust contamination compared to butt-joint connectors or splicing units.

Due to the small size of fibre Bragg gratings and the ability to chain in very small spaces, the memory 302 may be a fully encapsulated part of the optical connector 306 (like a small stub or dongle) or encapsulated in a connector with other pins/connections (for example embedded with the power connector) with no second fibre 307*b* leaving the connector 306.

Figure 5:
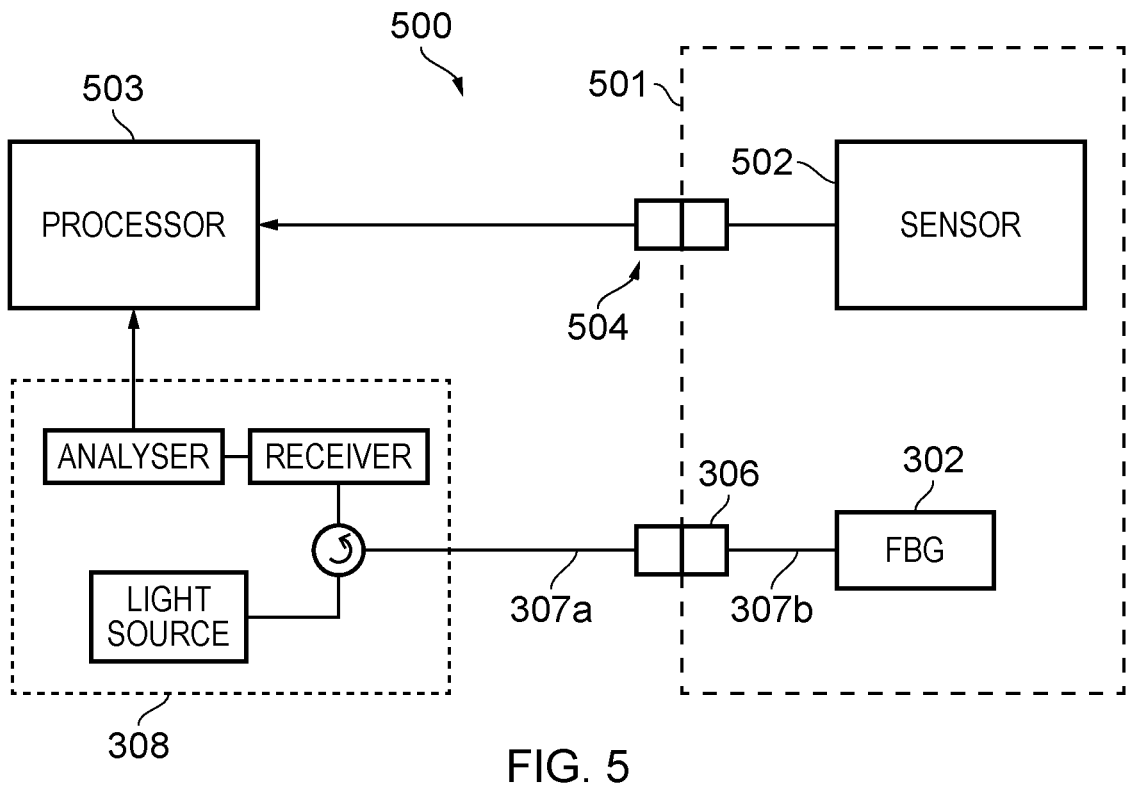
FIG. 5 shows an avionics system with a single sensor LRU.

FIG. 5 shows an avionics system 500 installed on the aircraft 1. Some of the elements of the system are identical to the elements shown in FIG. 3A and these elements will not be described again. In the case of FIG. 3A, the memory 302 is a permanent part of the avionics system 300—in other words it is not part of an LRU and could be part of the aircraft wiring. In the case of FIG. 5 the memory 302 is part of a sensor LRU 501.

The LRU in this case is a sensor LRU 501 which includes a sensor 502 such as a temperature sensor or strain gauge. The sensor 502 outputs a sensor signal, such as a voltage, to a processor 503 via an electrical connector 504. Calibration data is required to correlate the sensor signal with the measured parameter (e.g. temperature or strain). This calibration data is determined during manufacture of the sensor 502, represented by static information held by the memory 302, and the sensor 502 and its associated memory 302 are packaged together within the sensor LRU 501. So the sensor LRU 501 carries its own unique calibration data, encoded within the memory 302.

The processor 503 (which may be a permanent part of the system 500 such as a flight control computer, or it may itself be part of an RDC which is itself an LRU) receives the sensor signal via the electrical connector 504, receives the static information from the interrogator 308, and processes the sensor signal in accordance with the calibration data represented by the static information.

The static information may contain all of the calibration data—such as coefficients for a linear or non-linear transform function used to convert the voltage into the desired measured parameter. Alternatively, if the calibration data can be reduced to one of a limited number of calibration data sets, then these data sets could be stored in a look-up-table which is accessed by the processor 503 and selected based on the static information. Alternatively the static information may be a serial number which is used to obtain a detailed set of calibration data from the manufacturer which can then be dataloaded.

If the sensor LRU 501 is replaced, then the new sensor LRU brings its own calibration data so it is not necessary to reconfigure the processor 503 or perform any other time consuming tasks.

In this example the sensor 502 outputs a sensor signal, such as a voltage, to a processor 503 via an electrical connector 504. In an alternative embodiment the sensor may be an optical fibre sensor (such as a Bragg grating strain or temperature sensor) on the same fibre as the memory 302, so in this case the sensor signal travels via the same fibres 307*a,b* as the light to and from the interrogation unit 308.

Figure 6:
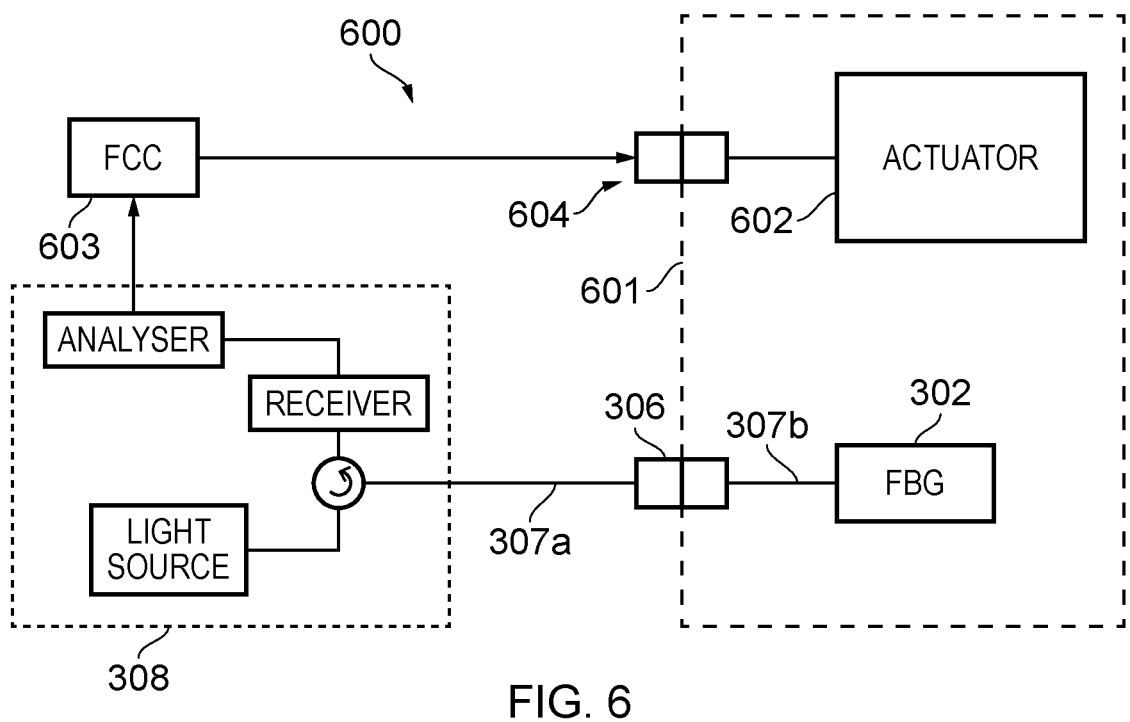
FIG. 6 shows an avionics system with a single actuator LRU.

FIG. 6 shows an avionics system 600 installed on the aircraft 1. Some of the elements of the system are identical to the elements shown in FIG. 3A and these elements will not be described again. In the case of FIG. 5 the memory 302 is part of an actuator LRU 601.

The actuator LRU 601 includes an actuator 602 such as a hydraulic cylinder or electric motor. A flight control computer (FCC) 603 outputs control signals to the actuator 602 via an electrical connector 604. The static information etched in the memory 302 represents a unique ID of the actuator LRU 601, and this ID is used by the FCC 603 to address the actuator LRU 601 and ensure that the actuator 602 receives the correct control signals.

Figure 7:
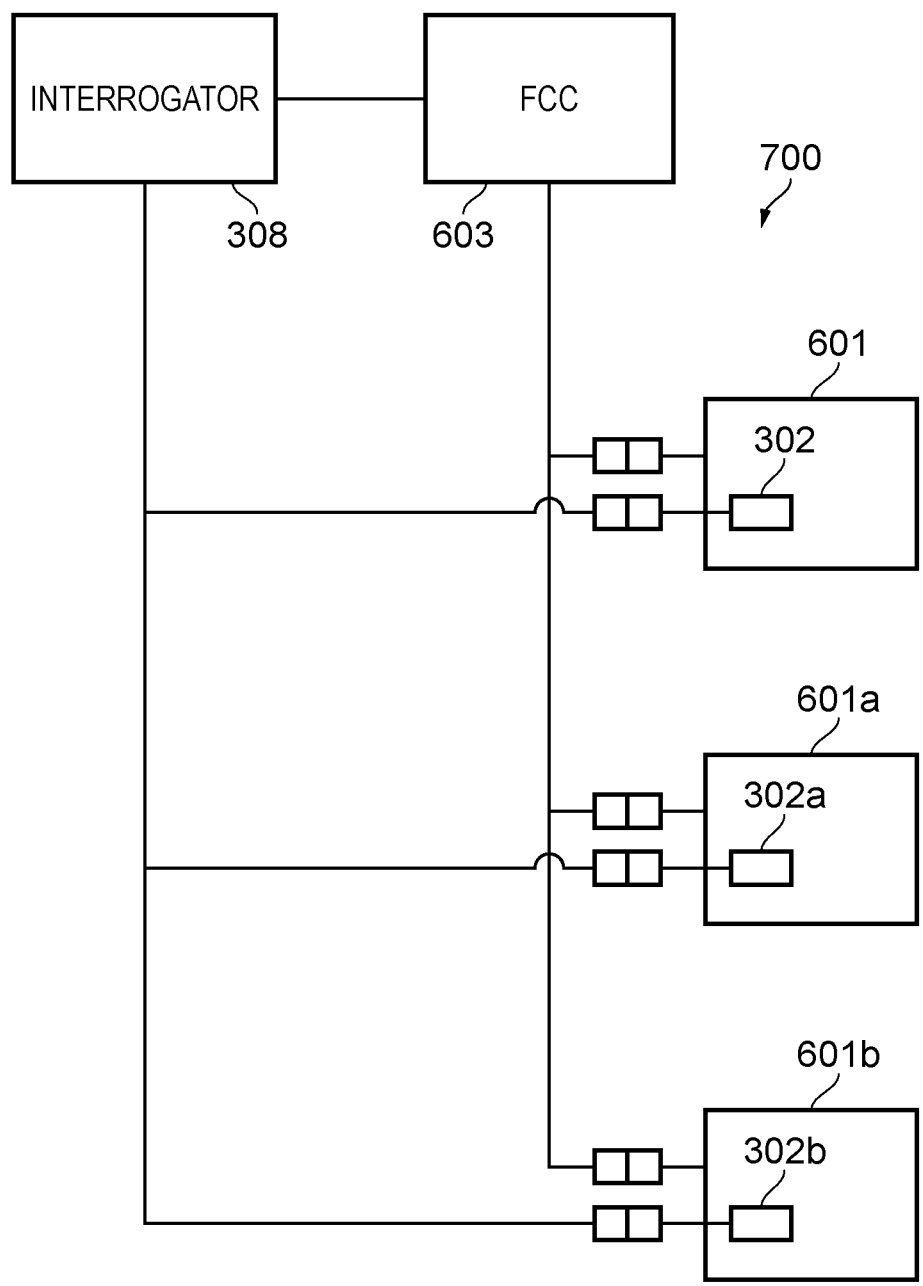
FIG. 7 shows an avionics system with multiple actuator LRUs interrogated by wavelength division multiplexing.

FIG. 7 shows an avionics system 700 containing the actuator LRU 601 and two further actuators LRUs 601*a*, 601*b* which are identical to the LRU 601 except that they have different IDs. The three actuator LRUs 601, 601*a*, 601*b* are connected to the interrogator 308 via an optical fibre network and to the FCC 603 via an electrical network.

In the example of FIGS. 3A, 3B, 5 and 6 there is a one-to-one relationship between interrogators and memories, but in the case of FIG. 7 a single interrogator interrogates multiple memories. The first LRU 601 has a first memory 302 storing first static information (the unique ID of the LRU 601), the second LRU 601*a* has a second memory 302*a* storing second static information (the unique ID of the LRU 601*a*) and the third LRU 601*b* has a third memory 302*b* storing third static information (the unique ID of the LRU 601*b*). The light source of the interrogator 308 is configured to simultaneously transmit the interrogation light to the three memories 302, 302*a*, 302*b* via the optical fibre network, and the receiver of the interrogator 308 is configured to receive first, second and third return light from the first, second and third memories 302, 302*a*, 302*b* respectively via the same optical fibre network. The analyser 318 is configured to analyse the first, second and third return light from the memories 302, 302*a*, 302*b* to obtain the three unique IDs which it forwards to the FCC 603. The FCC 603 can then use the three unique IDs to address control signals to the LRUs via the electrical network.

The interrogator 308 of the system 700 uses wavelength division multiplexing to simultaneously interrogate the three LRUs. The interrogator 308 transmits the interrogation light to the memories simultaneously and receives the return light from them substantially simultaneously. The analyser of the interrogator 308 is configured to associate the first static information with the first LRU 601, the second static information with the second LRU 601*a*, and the third static information with the third LRU 601*b* based on wavelength characteristics of the first, second and third return light. So for example the chain in the first memory 302 has up to four gratings with wavelengths $\lambda_1$, $\lambda_2$, $\lambda_3$ and $\lambda_4$; the chain in the second memory 302*a* has up to four gratings 204 with different wavelengths $\lambda_5$, $\lambda_6$, $\lambda_7$ and $\lambda_8$; and the chain in the third memory 302*b* has up to four gratings with different wavelengths $\lambda_9$, $\lambda_{10}$, $\lambda_{11}$ and $\lambda_{12}$.

Figure 8:
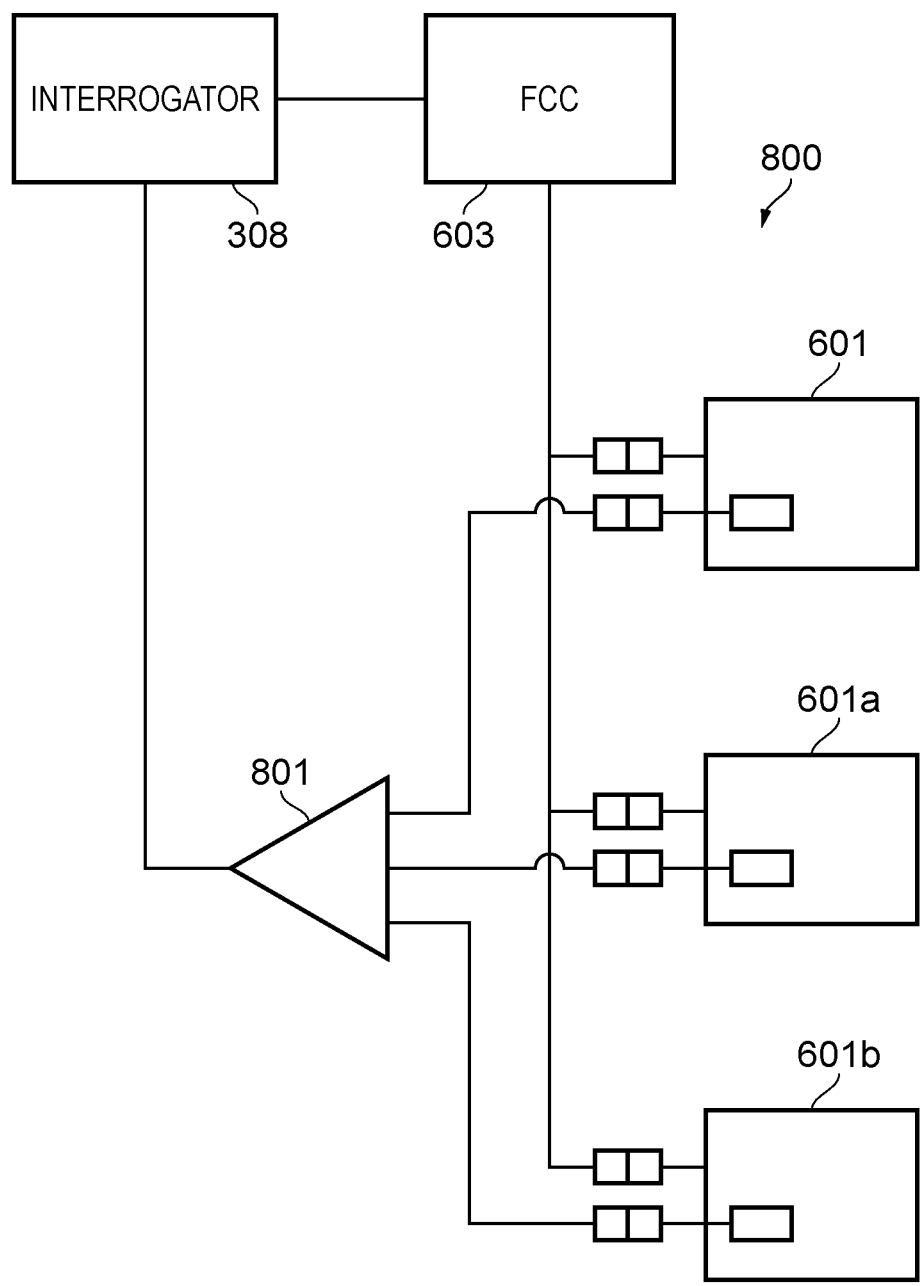
FIG. 8 shows an avionics system with multiple actuator LRUs connected by a switch.

FIG. 8 shows an avionics system 800 with some of the elements identical to the elements shown in FIG. 7 and these elements will not be described again. In this case the LRUs are interrogated sequentially via a switch 801, rather than being interrogated in parallel. This arrangement is advantageous in that it allows the same wavelengths to be used by the LRUs, enabling identical (but differently identified) LRUs to be reused.

Figure 9:
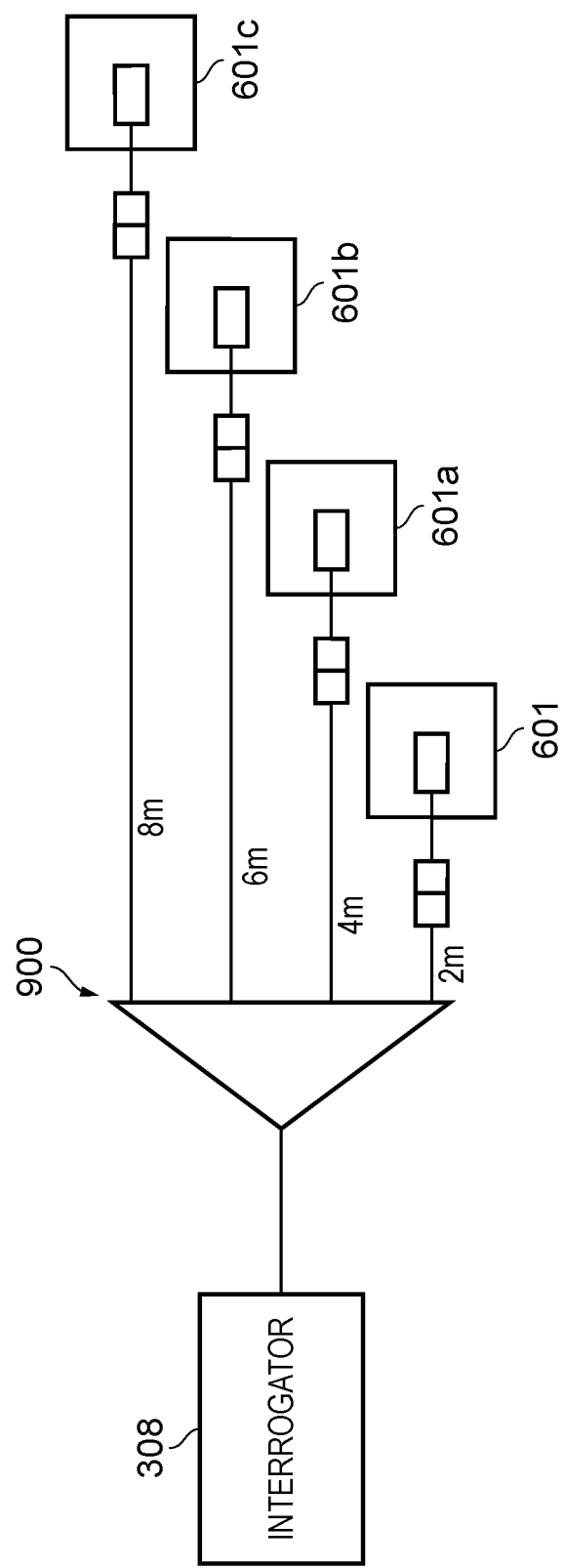
FIG. 9 shows an avionics system with multiple actuator LRUs interrogated by time division multiplexing.

FIG. 9 shows an avionics system 900 with some of the elements identical to the elements shown in FIG. 7 and these elements will not be described again. In this case four LRUs 601, 601*a*, 601*b* and 601*c* are simultaneously interrogated, but the interrogator 308 of the system 800 uses time division multiplexing rather than wavelength division multiplexing to differentiate between the LRUs. The four LRUs 601, 601*a*, 601*b* and 601*c* are different distances from a splitter/combiner (in this case 2*m*, 4*m*, 6*m* and 8*m* away) so their return light arrives at different times. This time difference is used to associate the static information encoded in the return light with the four LRUs. The system also has knowledge of the location of the LRUs based on the distance to the splitter/combiner.

The LRUs 601, 601*a*, 601*b*, 601*c* in FIGS. 7-9 are all actuator LRUs which include an actuator such as a hydraulic cylinder or electric motor. A similar arrangement can be used to interrogate multiple sensor LRUs of the type shown in FIG. 5 with a single interrogator.

The actuator LRUs in FIGS. 7 and 8 are connected to the interrogator 308 via an optical fibre network and to the FCC 603 via an electrical network. In an alternative embodiment the communication with the interrogator 308 and the FCC 603 may be via the same optical fibre network.

The avionics system described above all include an LRU, but in other embodiments of the invention, the system may not include an LRU. For example a memory storing static information in one or more optical fibre gratings may be used to store a serial number for a large structural element of the airframe of the aircraft. This may be of use for logging health data for use in data analytics.

In an alternative embodiment, the memory 302 may contain a chirped fibre Bragg grating, long period gratings, or tilted fibre Bragg gratings. A chirped fibre Bragg grating can encode a large amount of static information, but is more susceptible to temperature drift.

The avionics systems described above are all installed on an aircraft 1 shown in FIG. 10. The aircraft 1 is illustrated with an actuator system installed, of the type shown in FIGS. 7-9, by way of example.

The aircraft 1 has an avionics bay in its nose cone, and in this example the avionics bay contains the interrogator 308 and FCC 603. Each wing has an aileron 2*a*, 2*b*. The port aileron 2a is driven by actuator LRU 601a and the starboard aileron 2b is driven by actuator LRU 601b.

Where the word 'or' appears this is to be construed to mean 'and/or' such that items referred to are not necessarily mutually exclusive and may be used in any appropriate combination.

Although the invention has been described above with reference to one or more preferred embodiments, it will be appreciated that various changes or modifications may be made without departing from the scope of the invention as defined in the appended claims.

The invention claimed is:

1. A system installed on an aircraft, the system comprising:
   first and second memories storing first and second static information respectively in one or more optical fibre gratings;
   first and second replaceable units, each replaceable unit comprising a light source configured to transmit interrogation light to the first or second memory;
   a receiver configured to receive light from the first or second memory; and
   an analyser configured to analyse the light from the first or second memory to obtain the static information, wherein the light source, the receiver and the analyser are part of an interrogator, and each a replaceable unit can be removed from the system by breaking one or more optical connections between the memory and the interrogator;
   wherein each replaceable unit comprises multiple software configurations and a processor capable of executing multiple software configurations, the software configuration which is executed by the processor is determined by the static information obtained from the memory, the analyser is configured to transmit the static information to the processor, and the processor is configured to select the appropriate software configuration accordingly; and,
   wherein the first static information stored in the first memory is different from the static information stored in the second memory so that the first replaceable unit will execute a different software configuration to the second replaceable unit and the first and second replaceable units will perform different functions.

2. A system according to claim 1 wherein the light from the memory is return light reflected from the memory; the light source is configured to transmit the interrogation light to the memory via an optical connection; the receiver is configured to receive the return light from the memory via the optical connection; and the interrogator is part of a replaceable unit which can be removed from the system by breaking the optical connection.

3. A system according to claim 2, wherein the optical connection comprises a first optical fibre optically coupled to the receiver and the light source; a second optical fibre optically coupled to the memory; and an optical connector which optically couples the first optical fibre to the second optical fibre.

4. A system according to claim 2, wherein the optical connection can be broken by decoupling the first optical fibre from the second optical fibre.

5. A system according to claim 2, wherein the optical connection can be broken by dismantling the optical connector; or removing one of the optical fibres from the optical connector.

6. A system according to claim 1, wherein the one or more optical fibre gratings are fibre Bragg gratings.

7. A system according to claim 1, wherein the one or more optical fibre gratings are two or more optical fibre gratings arranged in an optical fibre grating chain.

8. A system according to claim 1, wherein the one or more optical fibre gratings store the static information in binary format.

9. A plurality of systems according to claim 1, each installed on said aircraft, wherein the memories store different static information.

10. A system according to claim 1, wherein the memory is a first memory, the static information is first static information, and the system further comprises a second memory storing second static information in one or more optical fibre gratings, the second static information being different to the first static information, and wherein the light source is configured to transmit the interrogation light to the first and second memories, the receiver is configured to receive first and second light from the first and second memories respectively, and the analyser is configured to analyse the first and second light to obtain the first and second static information.

11. A system according to claim 10, wherein the light source is configured to transmit the interrogation light to the first and second memories substantially simultaneously, the receiver is configured to receive the first and second light substantially simultaneously, and the analyser is configured to associate the first static information with the first memory and the second static information with the second memory based on wavelength characteristics of the first and second light.

12. A system according to claim 10, wherein the light source is configured to transmit the interrogation light to the first and second memories substantially simultaneously, the receiver is configured to receive the first and second light from the first and second memories at different times, and the analyser is configured to associate the first static information with the first memory and the second static information with the second memory based on the time at which the first and second light is received.

13. An aircraft with one or more systems according to claim 1 installed on the aircraft.

14. A system according to claim 1 wherein the replaceable unit comprises a processor capable of executing multiple software configurations, and the software configuration which is executed by the processor is determined by the static information obtained from the memory.

15. A system according to claim 14 wherein the analyser is configured to transmit the static information to the processor, and the processor is configured to select the appropriate software configuration accordingly.

16. A system installed on an aircraft, the system comprising:
   a first memory storing first static information in one or more optical fibre gratings;
   a second memory storing second static information in one or more optical fibre gratings, the second static information being different to the first static information;
   a light source configured to transmit interrogation light to the first and second memories;
   a receiver configured to receive first and second light from the first and second memories respectively; and
   an analyser configured to analyse the light from the memories obtain the first and second static information, wherein the first memory is part of first replaceable unit which can be removed from the system by breaking one or more optical connections between the first memory and the rest of the system, the second memory is part of a replaceable unit which can be removed from the system by breaking one or more optical connections between the second memory and the rest of the system, the light source is configured to transmit the interrogation light to the first and second memories substantially simultaneously, the receiver is configured to receive the first and second light substantially simultaneously, and the analyser is configured to associate the first static information with the first memory and the second static information with the second memory based on wavelength characteristics of the first and second light.

17. The system of claim 16, wherein the replaceable unit comprises an actuator, an avionics computer or a remote data concentrator.

18. The system of claim 16, wherein the replaceable unit comprises one or more sensors.

\* \* \* \* \*